United States Patent [19]
Ho

[11] Patent Number: 6,124,817
[45] Date of Patent: Sep. 26, 2000

[54] NOISE-EQUALIZED DAC AND DEVICE CAPABLE OF EQUALIZING NOISE IN SRAM

[75] Inventor: Yung-Yuan Ho, Hsinchu Hsien, Taiwan

[73] Assignee: Industrial Technology Research Institute, Hsinchu, Taiwan

[21] Appl. No.: 09/481,944

[22] Filed: Jan. 13, 2000

Related U.S. Application Data

[62] Division of application No. 09/081,865, May 21, 1998.

[30] Foreign Application Priority Data

Jan. 7, 1998 [TW] Taiwan ................... 87100323

[51] Int. Cl.⁷ ...................................... H03M 1/66
[52] U.S. Cl. .................................... 341/144; 341/118
[58] Field of Search ................. 341/144, 100, 341/156, 118, 120; 365/210, 226, 218; 326/49; 327/94; 257/500

[56] References Cited

U.S. PATENT DOCUMENTS 5,973,632 10/1999 Tai .................................. 341/156
5,995,028 11/1999 Tai .................................. 341/100

OTHER PUBLICATIONS

Wallace et al, "Fast–Transient Susceptibility of a D–Type Flip–Flop," IEEE, 75–80, Feb. 1995.

*Primary Examiner*—Patrick Wamsley
*Attorney, Agent, or Firm*—Jacobson, Price, Holman & Stern, PLLC

[57] ABSTRACT

The present invention discloses a digital-to-analog converter (DAC) with noise equalized and a device capable of equalizing noise in SRAM. In the DAC, when the BLANK signal is high, a transient current still flows to ground for equalizing noise. The device capable of equalizing noise in SRAM comprises a dummy read/write memory cell for adding read/write operations and a auto-detection circuit for detecting when to add read/write operations.

5 Claims, 12 Drawing Sheets

NOISE-EQUALIZED DAC AND DEVICE CAPABLE OF EQUALIZING NOISE IN SRAM

This is a Divisional of application Ser. No. 09/081,865 filed May 21, 1998.

BACKGROUND OF THE INVENTION

1. Field of the Invention

The present invention relates to a digital-to-analog converter (DAC) and a device related to SRAM, and especially relates to a noise-equalized DAC and a device capable of equalizing noise in SRAM.

2. Description of the Related Art

When mixed signal integrated circuits, comprising analog circuits and digital circuits, are developed, how to process noise is an important subject, especially in highly integrated circuits.

For example, in a mixed signal image processing integrated circuits on a chip or on a application board comprising an ADC, DAC and SRAM, the DAC and SRAM may affect the sampling level of the ADC. This may cause static having a different grade level compared with its neighborhood.

The following statements describe how an ADC is affected by the DAC and the SRAM.

(1) How DAC affects the sampling level of an ADC

When the ADC is sampling image data, if the DAC receives a BLANK signal at this moment, the DAC must make the whole screen black. A non-equalization noise burst occurs at the same time as each horizontal line. This non-qualization noise burst affects the sampling level of the DC through the noise path and causes static having a different grade level compared with its neighborhood.

Now refer to FIG. 1A which shows a DAC timing sequence chart for each horizontal line. During time period C to F, the ADC converts analog signals into digital signals. The DAC works in time period B to D and time period E to G. In time period D to E, the current source of the DAC is forced into a sleep state due to a high voltage state of BLANK signal. At the edge of the high voltage state of BLANK signal, a large transient current, originally occurring in the DAC, does not flow to the GND terminal. This sudden change in transient current causes a non-equalized noise burst.

FIG. 1B shows a structural diagram of a conventional DAC. As shown in FIG. 1B, a DAC comprises a thermal code decoder 10, a plurality of D-type flip-flops 20, a plurality of preprocessors 30, and a plurality of current sources 40.

FIG. 1C is a circuit diagram of the current source of a DAC of the prior art. Transistor P1 supplies a fixed current. Transistor P2 controls the current source in a sleep state when the BLANK signal is high. Transistors P3 and P4 receive signals DA and DA_BAR through their gates, wherein the signal DA_BAR is an inverted signal of signal DA. When the signal DA is "0," the transistor P4 is ON, and the transistor P3 is OFF. Conversely, when the signal DA is "1," the transistor P4 is OFF, and the transistor P3 is ON. When the BLANK signal arrives, the transistor P2 is turned off and turns off the current source. Therefore, a non-equalization noise burst occurs.

FIG. 2 is a simulation result for the transient current of the DAC. In FIG. 2, I27 represents the current flowing through the transistor P3 of FIG. 1C and the signal OUT is the voltage at terminal out of FIG. 1C. When the BLANK signal is high, the screen becomes black because of the voltage of OUT is 0V and the current signal I27 is turn to 0 mA simultaneously.

Because the DAC randomly converts image data, the non-equalization noise burst occurs randomly. When the image data at edge of the BLANK signal has a darker hue, the non-equalization noise is more intense, and vice versa.

Since a screen consists of hundreds of horizontal lines, some fixed regions of the screen may have a different grade level compared with adjacent area.

When the hue of image data is lighter, the transient current at GND terminal (VSS_DAA in FIG. 1C) is smaller, and a smaller change in transient current occurs in case of a high BLANK signal, and vice versa.

(2) How SRAM affects the sampling level of an ADC

Now refer to FIG. 3A, which is a timing sequence chart of a mixed image processing IC which comprises an ADC and SRAM. In FIG. 3A, signal RE and WE represent a read and write operation of SRAM, respectively. The signals RCLK and WCLK represent read and write clocks, respectively. The signal ADC represents the operation period of the ADC circuit. As shown in FIG. 3A, the ADC circuit converts analog signals into digital signals in time period C to F. However, the SRAM only executes a write operation in time period D to E, and executes both read and write operations in time period C to D and period E to F. Therefore, read/write operations are not uniform in time period D to E. From simulations of transient currents, it is known when the read/write operations are not uniform in one period, the transient current becomes smaller and a non-equalization noise burst will occur.

FIG. 3B is a block diagram of applying SRAM for read/write operations of the prior art. In FIG. 3B, RADDR0 and RADDRn represent the LSB (least significant bit) and MSB (most significant bit) of the reading address, respectively. The signal R_RESET and W_RESET are used to reset the read and write counter respectively.

Therefore, there is a need to improve upon the disadvantages of the prior art.

SUMMARY OF THE INVENTION

The present invention discloses a noise-equalized DAC and a device capable of equalizing noise in SRAM.

By applying the present invention, the quality of the image processing IC is improved greatly and there is little additional cost. Therefore, the present invention has much commercial potential.

DESCRIPTION OF THE DRAWINGS

Other objects, features, and advantages of the present invention will become apparent from the following detailed description made with reference to an illustrative but non-limiting embodiment. The description is made with reference to the accompanying drawings, in which.

DESCRIPTION OF THE PREFERRED EMBODIMENT

Embodiment 1: Device capable of equalizing noise in SRAM

The device capable of equalizing noise in SRAM comprises a dummy memory cell for adding read/write operations and an auto-detection circuit for detecting when the dummy memory cell should add a read/write operation.

The auto-detection circuit consists of logic gates. If the LSB of the read/write address signal does not alter any more, that means the SRAM has stopped read/write operation. Then, the auto-detection circuit will detect this situation and drive the dummy memory cell to add a dummy read/write operation. Therefore, the read/write operation can be uniform in one period, and the disadvantage of the prior art is overcome.

Figure 4A:
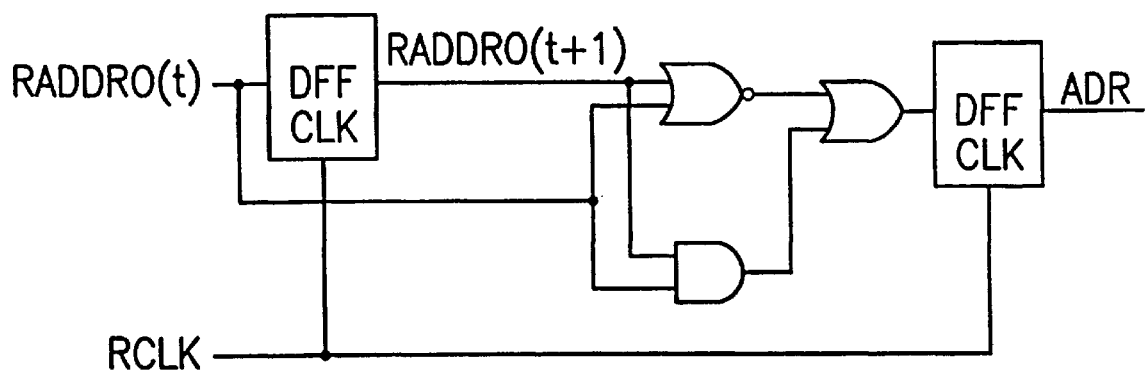
FIGS. 4A and 4B are circuit diagrams of an auto-detection circuit for one example of a device capable of equalizing noise in SRAM of the present invention.

Now refer to FIGS. 4A~4D showing the diagrams of the auto-detection circuit and dummy memory cell of this embodiment. FIG. 4A shows an auto-detection circuit consisting of logic gates. In FIG. 4A, a signal RADDR0(t) is delayed into a signal RADDR0(t+1) through a delay circuit DFF. After a logic XOR is performed on the RADDR0(t) and RADDR0(t+1), one signal is obtained. After a logic AND performed on the RADDR0(t) and RADDR0(t+1), another signal is obtained. Then a logic OR is performed on these two signals, and the result is delayed by another delay circuit DFF. The signal ADR is obtained. When the signal ADR is "1," the dummy read memory adds a dummy read operation to make read/write operations uniform.

Figure 4B:
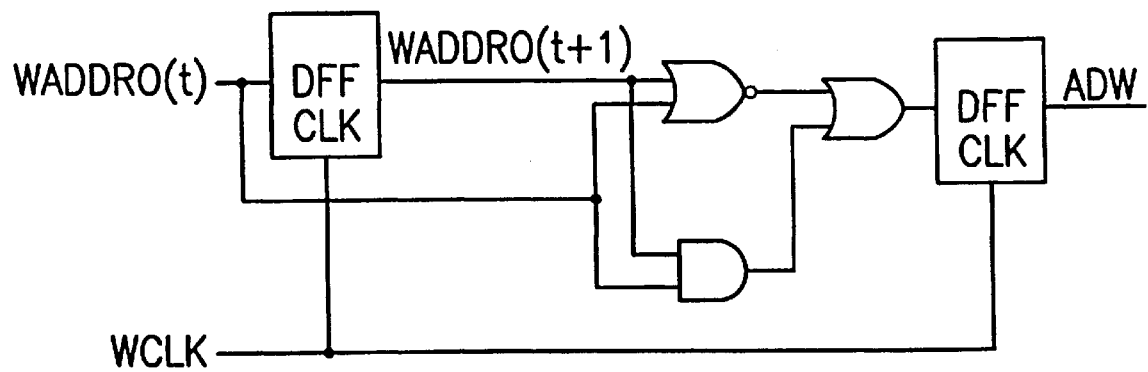

Similarly, in FIG. 4B, the signal ADW is obtained by a similar operation. When the signal ADW is "1," the dummy write memory cell adds a dummy write operation to make read/write operations uniform.

Figure 4C:
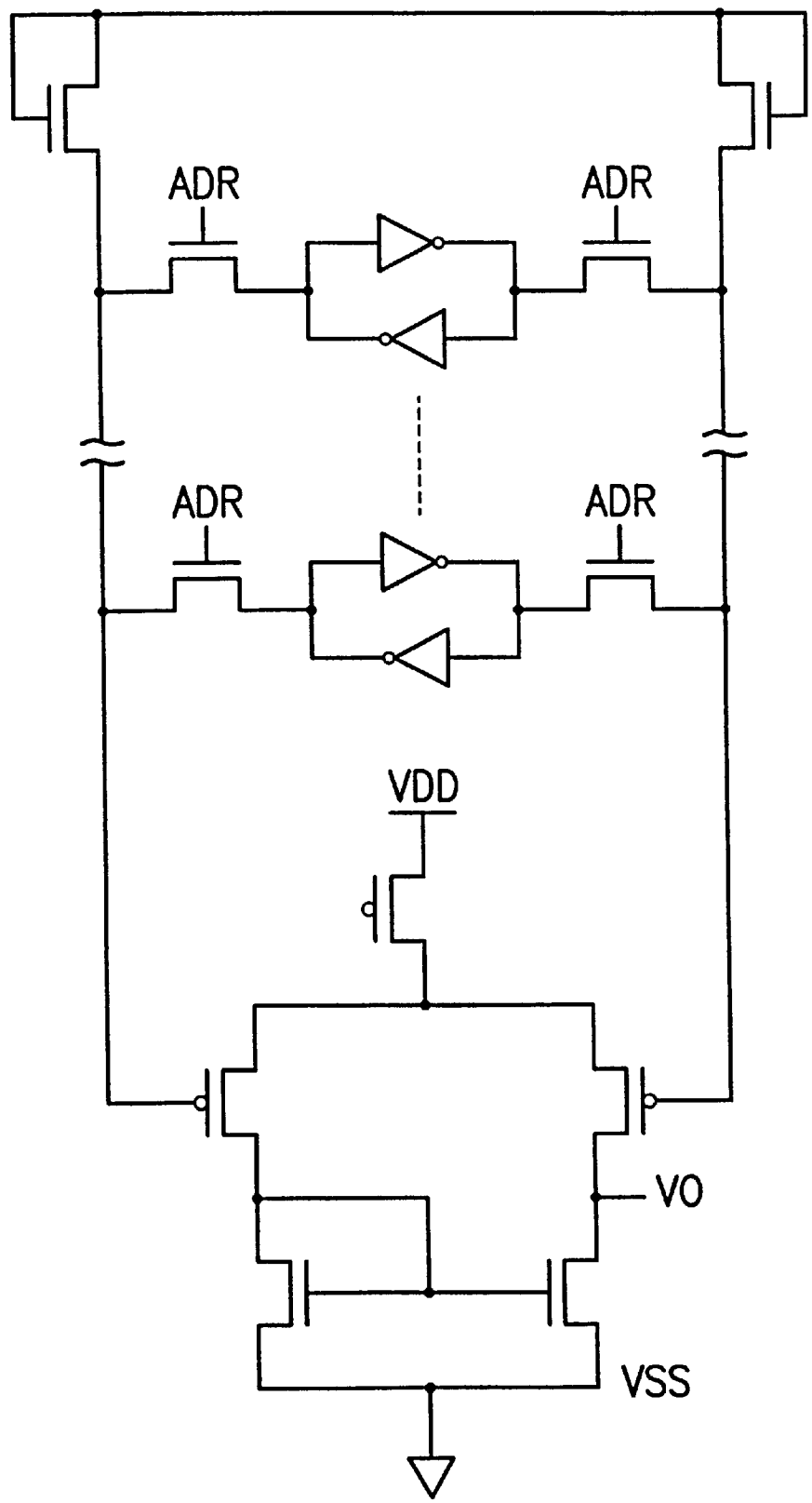
FIGS. 4C and 4D are structural diagrams of dummy read/write memory cells of the present invention.
Figure 4D:
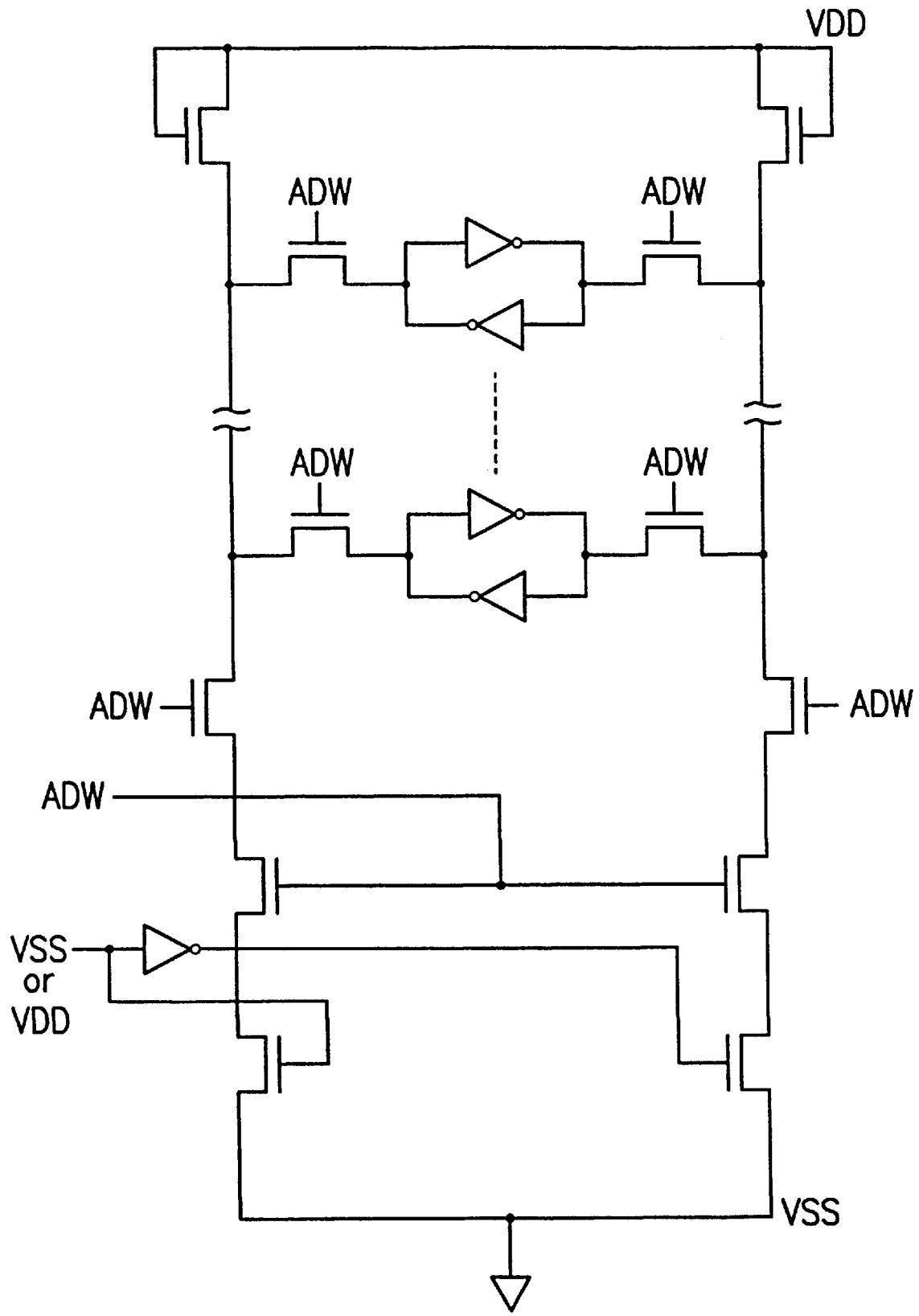

FIGS. 4C and 4D show structures of dummy read and write memory cells, respectively. As shown in FIGS. 4C and 4D, a dummy memory cell primarily consists of n sets of 6 transistors (6 T) or 4 T cells and other transistors.

The auto-detection circuit shown in FIGS. 4A or 4B is designed for random situations. That means at the moment RADDR0(t) or WADDR0(t) does not alter, the auto-detection circuit will detect and drive the dummy memory cell to add a read/write operation.

Figure 5A:
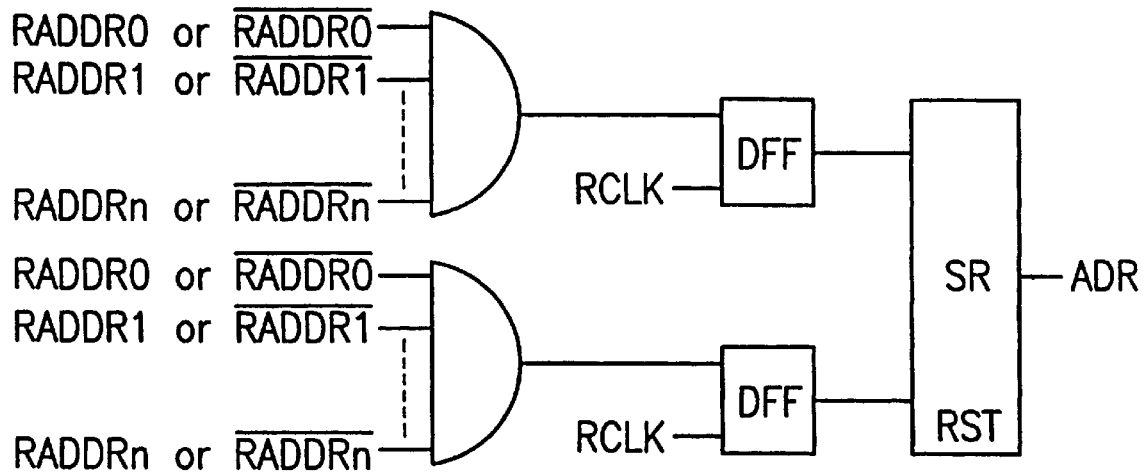
FIGS. 5A and 5B are circuit diagrams of an auto-detection circuit for another example of the present invention.
Figure 5B:
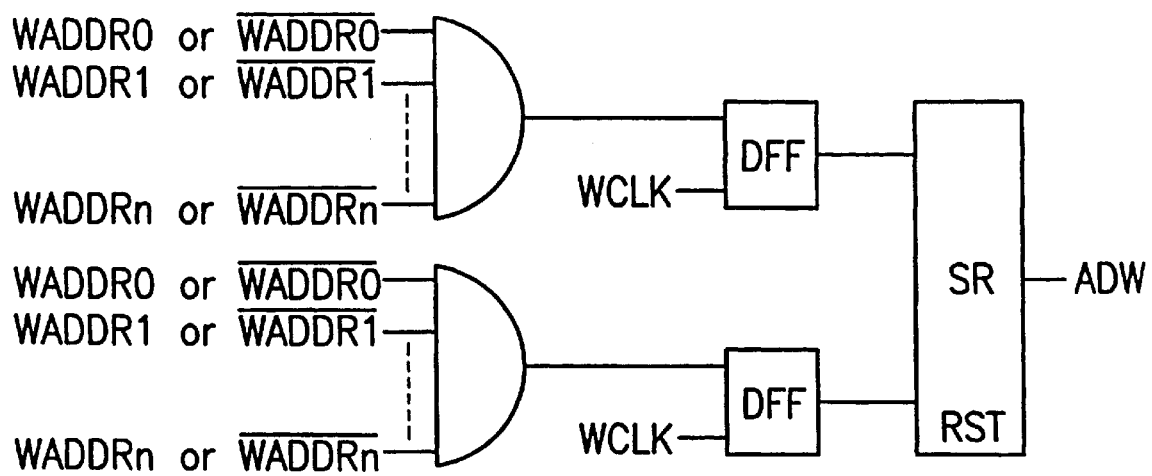

FIGS. 5A and 5B show another type of auto-detection circuit of this embodiment. This type of auto-detection circuit is designed for adding read/write operations by calculation. In FIG. 5A, the signals applied on each input pin of an AND gate may be RADDRm($0 \leq m \leq n$) or RADDRm~ ($0 \leq m \leq n$), wherein the signal RADDRm~ is an inverted signal of the signal RADDRm.

The following statements indicate if it needs to begin for adding a dummy read operation at 200th clocks and to stop the dummy read operation at 300th clocks. That means the signal ADR is high at 200~300 clocks, wherein 200 (decimal)=011001000 (binary), 300 (decimal)=100101100 (binary). The bit in binary is RADDRm. When the binary bit is 1, the signal RADDRm is applied to the AND gate, and vice versa. So in this case, RADDR0~; RADDR1~; RADDR2~; RADDR3; RADDR4~; RADDR5~; RADDR6; RADDR7; and RADDR8~ are applied to one AND gate. RADDR0~; RADDR1~; RADDR2; RADDR3; RADDR4~; RADDR5; RADDR6~; RADDR7~; and RADDR8 are applied to the other AND gate. The AND gate in FIG. 5B can be designed similarly for adding write operations.

When the auto-detection circuit detects a need to add read or write operations, the signal ADR/ADW will reset the reading/writing counter. That means the SRAM reads data from address 0 or write data into address 0. Dummy data skipped by subsequent circuits.

Figures 6, 7:
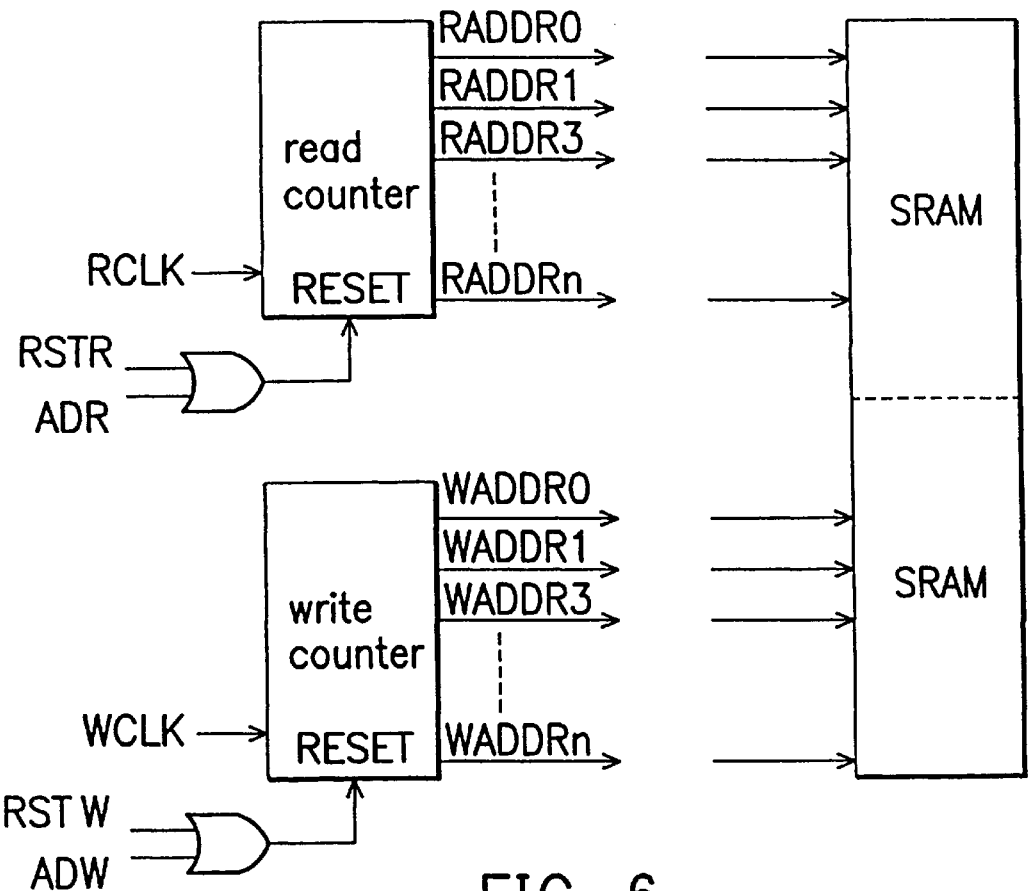
FIG. 6 is a structural diagram of one example of the device capable of equalizing noise of the present invention.
FIG. 7 shows decimal bits in Gray code and results after an XOR logic operation.

The auto-detection circuits described above are for processing address signals in binary bits. However, the present invention can be also applied when the address signal is in gray code. Now refer to FIG. 7 which shows an address signal in gray code. In FIG. 7, it is known that two adjacent codes have only one different bit. If one operation, EXOR= A8⊕A7⊕A6⊕A5⊕A4⊕A3⊕A2⊕A1, is performed, the result of EXOR on gray code is 1, 0, 1, 0 . . . . This result is similar to the LSB in binary bit. So the structures of the auto-detection circuit and dummy memory cell are the same as in the random case.

Embodiment 2: DAC with noise equalized

The disadvantages of the prior art rely on a large change in transient current when the signal BLANK is high. In the present invention, the signal BLANK does not depend on the transient current, but is only dependent on the image data DA.

Figure 8A:
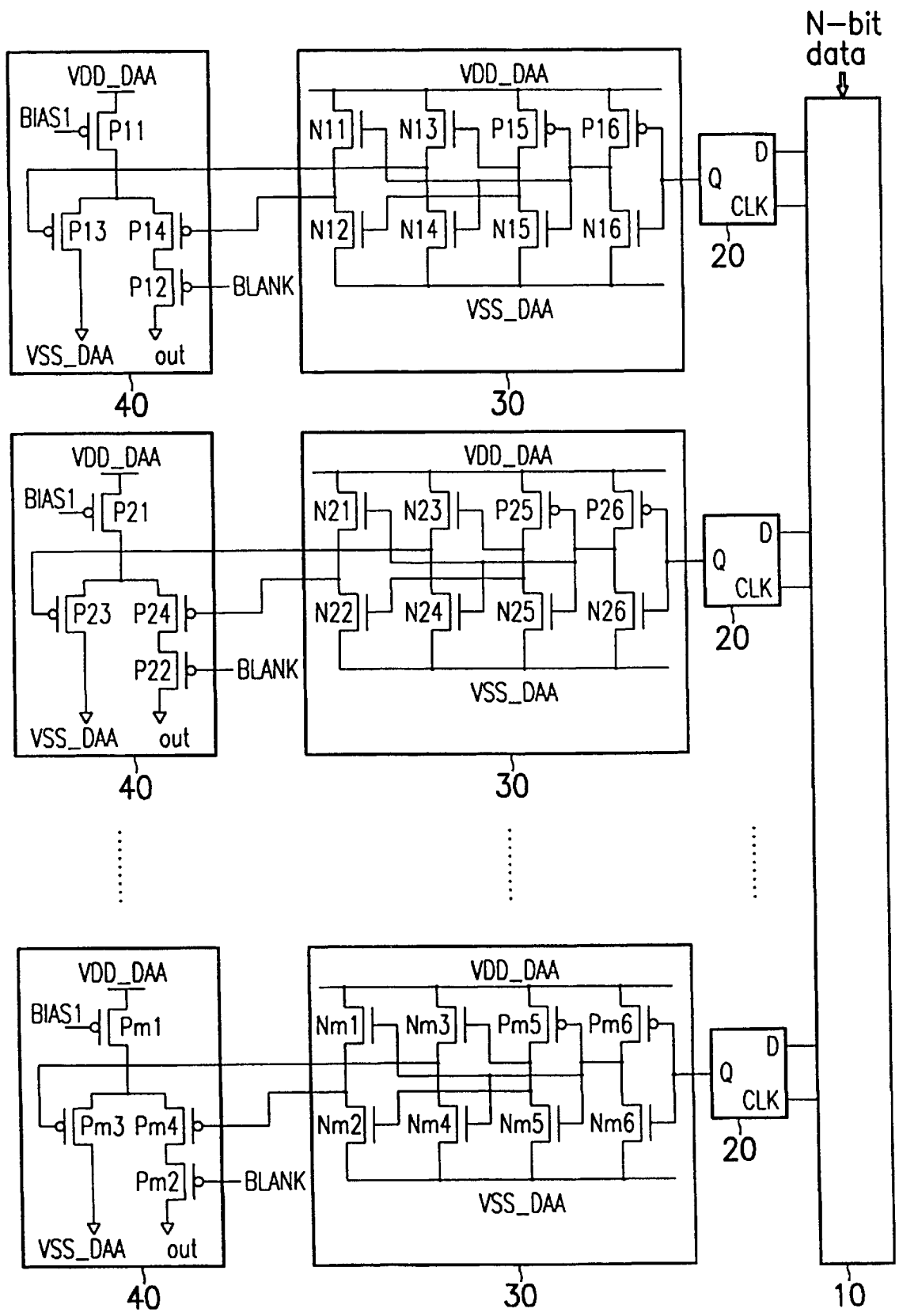
FIGS. 8A~8C are circuit diagrams of three examples of noise-equalized DACs of the present invention.
Figure 8B:
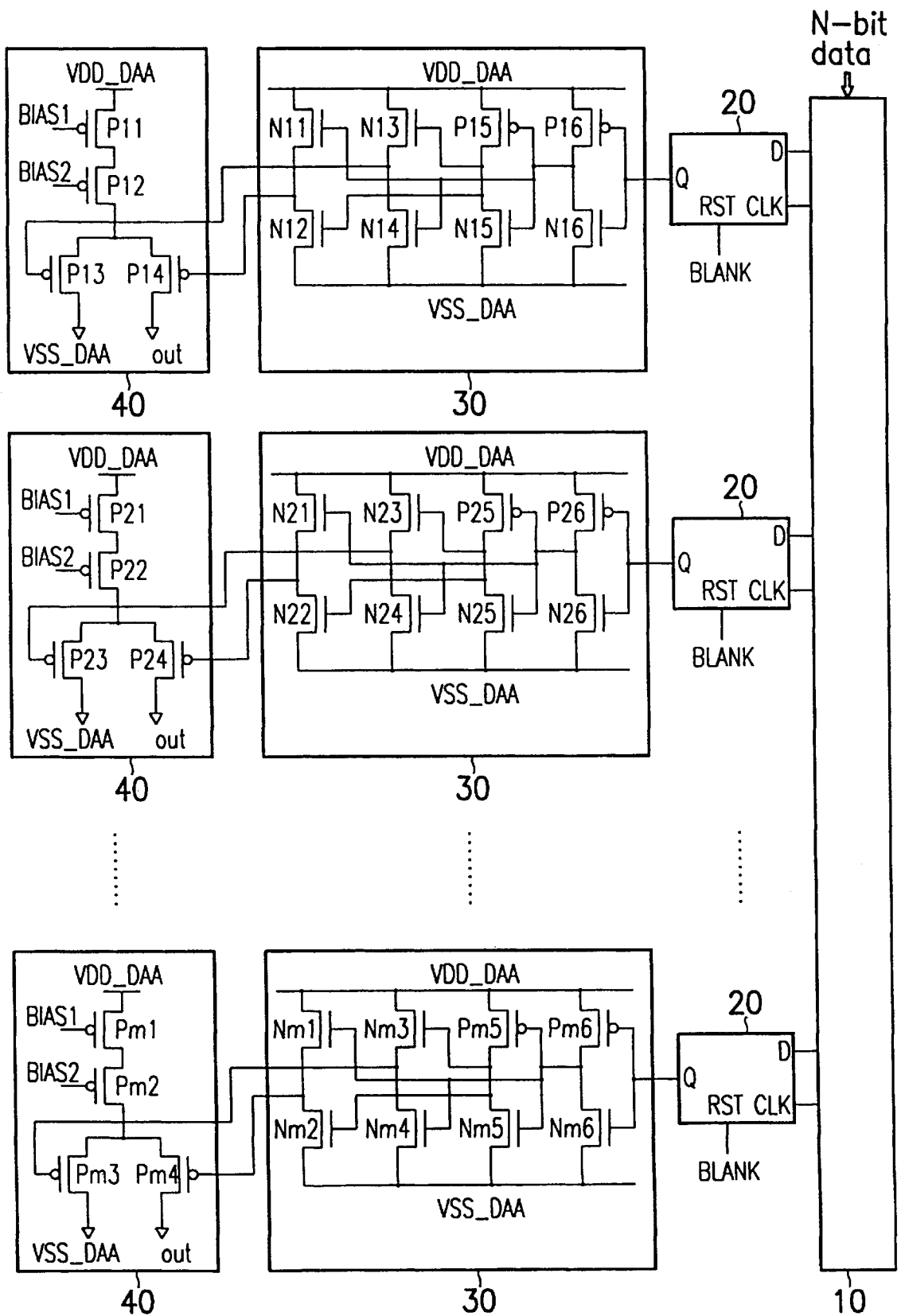
Figure 8C:
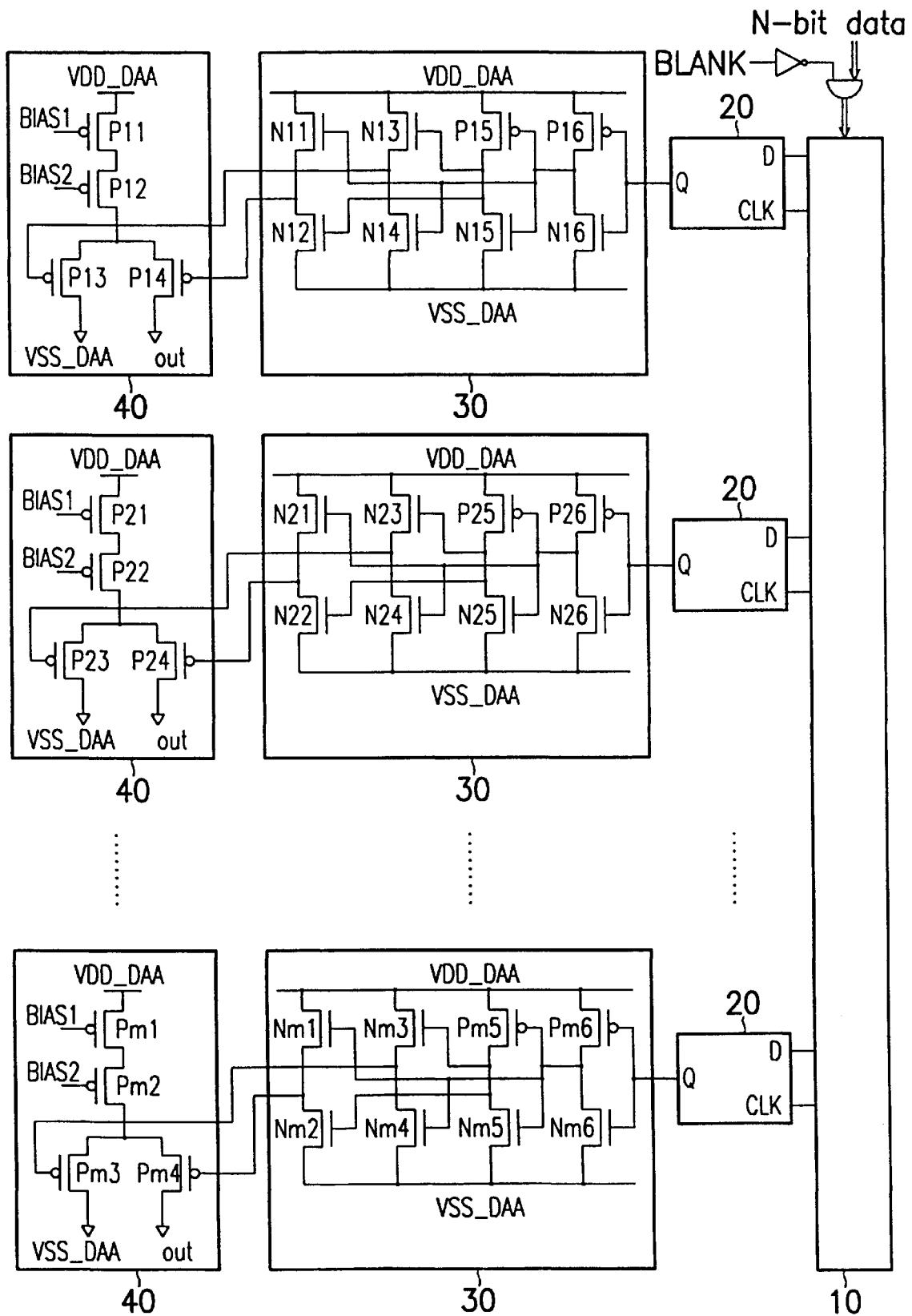

In FIGS. 8A~8C, the reference number 10, 20, 30 and 40 represent the thermal code decoder, D-type flip-flop, preprocessor, and current source, respectively.

Figure 1A:
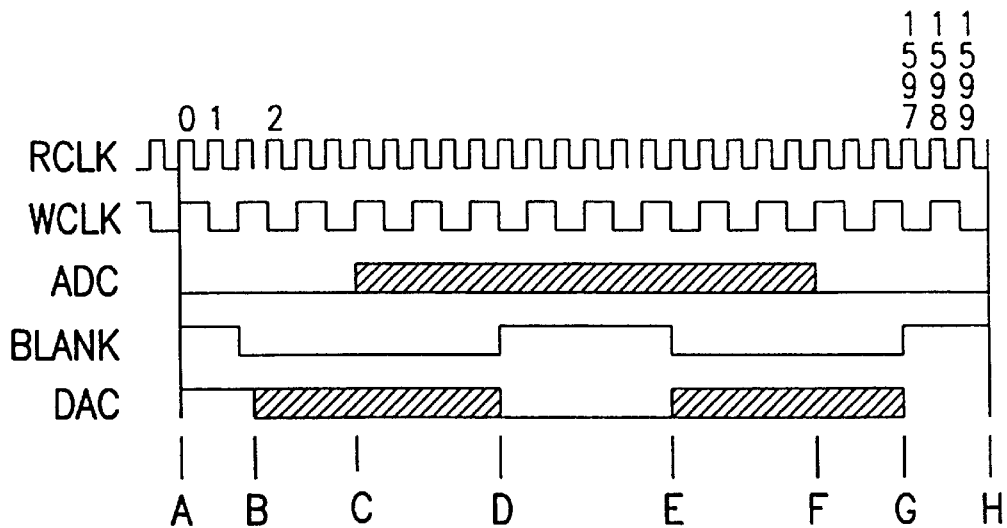
FIG. 1A shows a timing sequence chart of a DAC circuit and an ADC circuit of the prior art.
Figure 1B:
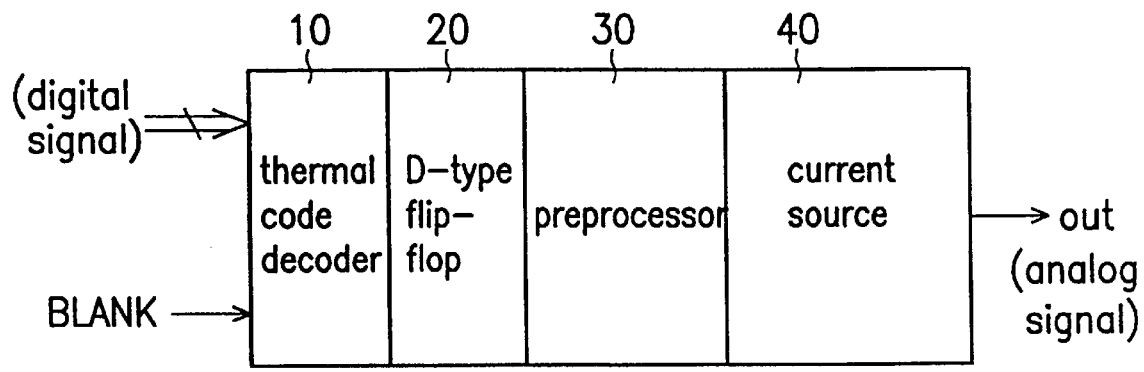
FIG. 1B is a structure diagram of the DAC of the prior art.
Figure 1C:
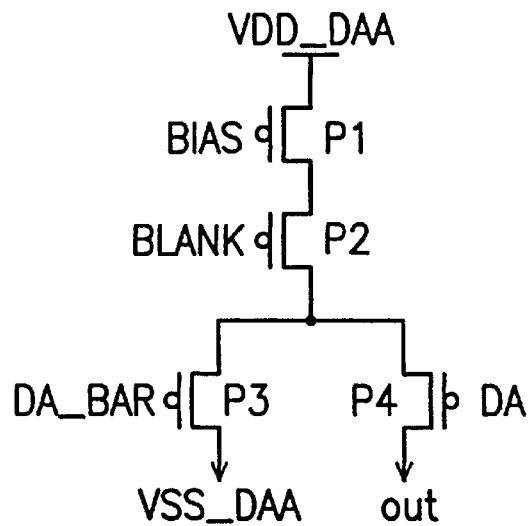
FIG. 1C is a circuit diagram of the current source of the conventional DAC.
Figure 2:
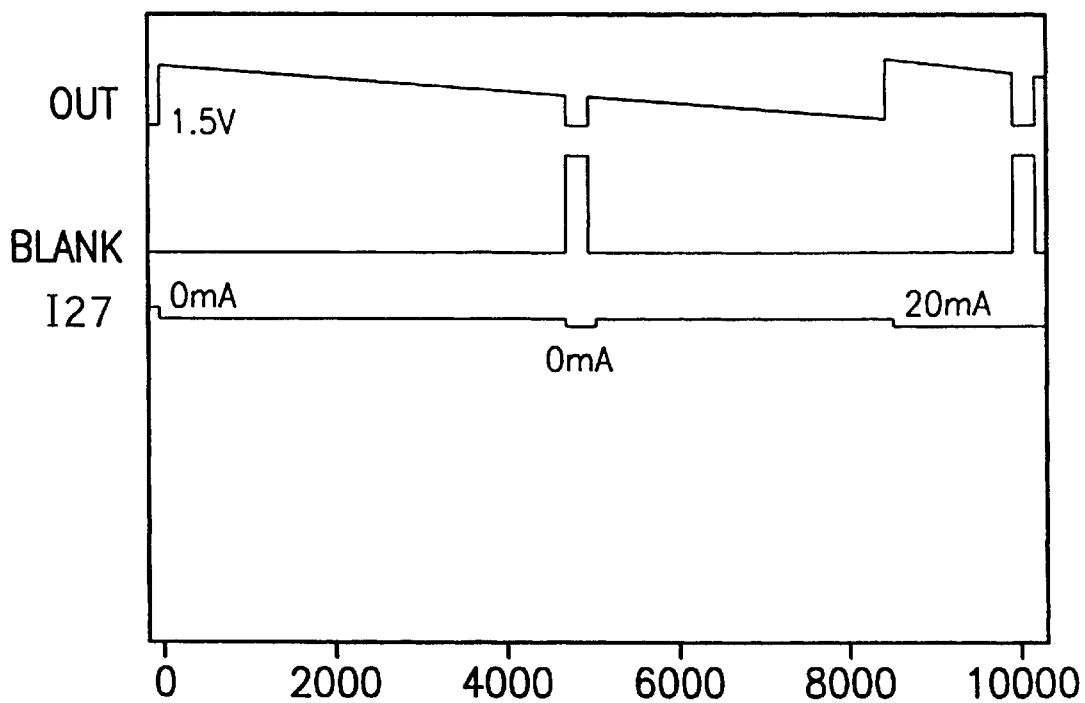
FIG. 2 is a transient simulation of a single-color, 8-bits DAC circuit.
Figure 3A:
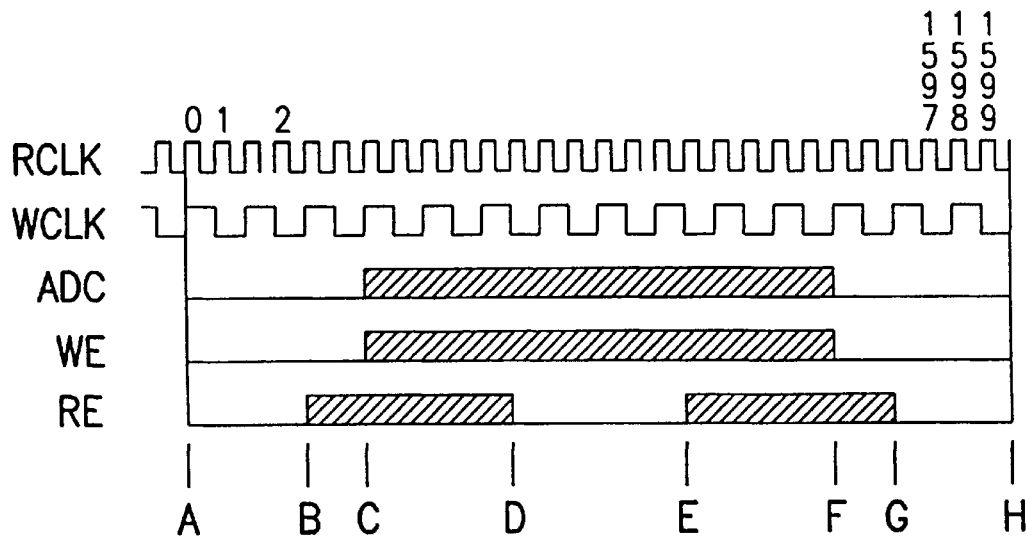
FIG. 3A is a timing sequence chart of the SRAM and ADC of the prior art.
Figure 3B:
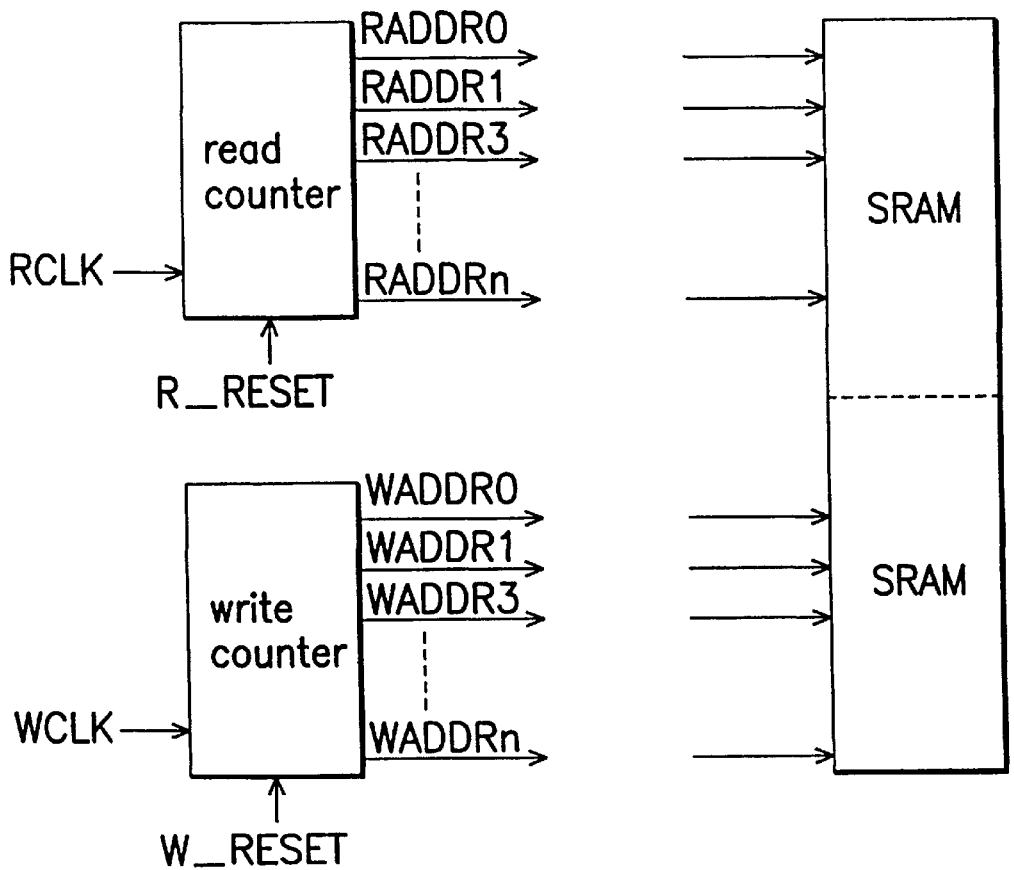
FIG. 3B is a block diagram of applying SRAM for read/write operations of the prior art.

FIG. 8A shows one example of this embodiment. The transistor (P11, P21~Pm1) receives a BIAS signal, the transistor (P12,P22,~Pm2) receives the BLANK signal. The transistors (P13, P23~Pm3) and (P14, P24,~Pm4) receive image data DA and DA~. Comparing FIG. 8A (the present invention) with FIG. 1C (the prior art), it is known that the transistor (P12, P22,~Pm2) is connected serially between the transistor (P14, P24,~Pm4) and the terminal OUT. Therefore, when the signal BLANK is high enough to turn off the transistor (P12, P22,~Pm2), the transient current still flows-to the ground-terminal VSS_DAA.

This embodiment can be in another form, as shown in FIGS. 8B and 8C. In FIG. 8B, the signal BLANK is coupled to a RST terminal of a D-type flip-flop. When the signal BLANK is high, the transistors (P13, P23,~Pm3) are turned on and the transistors (P14, P24, ~Pm4) are turned off. The current of GND terminal VSS_DAA I27 flowing through the transistors P13, P23~Pm3 is not 0 when the signal BLANK i, high. Therefore, the disadvantages of the prior art are overcome.

Now refer to FIG. 8C. An inverted signal of the signal BLANK is logic AND with each bit of the image data, then the result is coupled to a thermal code decoder 10.

When the signal BLANK is high, the result of the logic AND is 0 regardless of each bit of the image data. This akes outputs of the thermal code decoder 10 all 0, and the outputs Q of all D-type flip-flop 20 all 0. The transistor (P13,P23,~Pm3) is on. Therefore, the current of GND terminal VSS_DAA I27 flowing through the transistors (P13, P23,~Pm3) is not 0 when the signal BLANK is high. Thus, the disadvantages of the prior art are overcome.

In the three examples shown in FIGS. 8A–8C, the present invention can still work and the GND noise can be equalized. Image quality can be improved at the same time.

Figure 9:
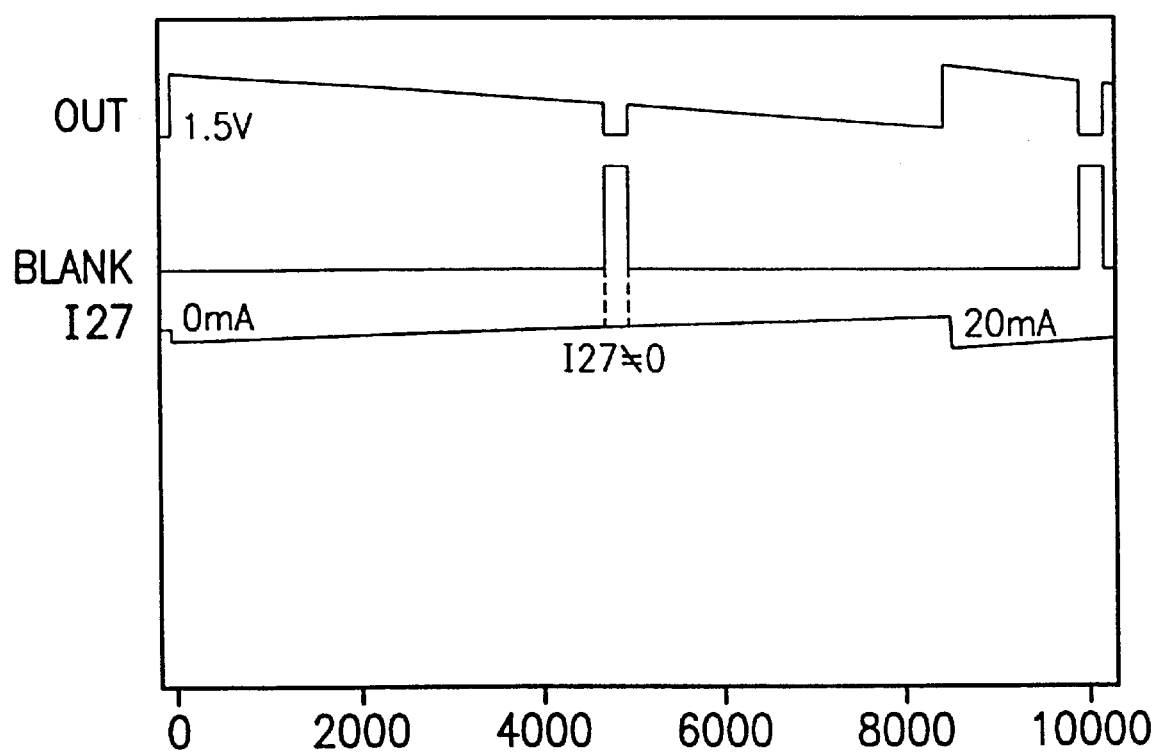
FIG. 9 is a simulation result of the transient current in a DAC circuit of the present invention.

Now refer to FIG. 9 which shows a simulation result of the DAC of the present invention. In FIG. 9, the signal OUT, which is the voltage signal of the terminal OUT, has a value equal to that of the current passing through the transistors (P14, P24, ~Pm4) multiplied by the output resistance (75 ohm). From FIG. 9, it is clear that when the signal BLANK is high, the current of GND terminal VSS_DAA I27 passing through the transistor (P13, P23,~Pm3) is not 0.

By applying the present invention, the quality of the image IC is improved greatly and the additional cost is little. Therefore, the present invention has much commercial potential.

Although the invention in connection with preferred embodiments has been described, modifications will now doubtlessly be apparent to those skilled in this technology. The foregoing description of the preferred embodiments of the invention has been provided for the purposes of illustration and description. It is not intended to be exhaustive or to limit the invention to the precise embodiment disclosed herein. The disclosed embodiment has been chosen and described to best explain the principles of the invention and its practical application, thereby enabling others skilled in this technology to understand the invention, to practice various other embodiments thereof and to make various modifications suited to the particular use contemplated of the present invention. As such, it is intended that the scope of this invention shall not be limited to the disclosed, but rather shall be defined by the following claims and their equivalents.

What is claimed is:

1. A DAC with noise equalized, placed between a voltage source and ground, driven by a bias device, receiving digital signals and a BLANK signal, comprising:
    a thermal code decoder, processing with said digital signals and said BLANK signal, having a plurality of outputs;
    a plurality of D-type flip-flops, processing said plurality outputs of said thermal code decoder;
    a plurality of preprocessors, each receiving the output of one corresponding D-type flip-flop and outputing a signal and an inverted signal of said signal; and
    a plurality of current sources, each receiving corresponding said signal and said inverted signal, each current source comprising:
    a first PMOS transistor, having a source connected to said voltage source, a gate connected to said bias device, and a drain;
    a second PMOS transistor, having a source connected to said drain of said first PMOS transistor, a gate receiving said signal, and a drain;
    a third PMOS transistor, having a source connected to said drain of said first PMOS transistor, a gate receiving said inverted signal, and a drain connected to said ground; and
    a fourth PMQS transistor, having a source connected to said drain of said second PMOS transistor, a gate receiving said BLANK signal, a drain acting as the output of said DAC when said BLANK is high and said third PMOS transistor is off.

2. A DAC with noise equalized, placed between a voltage source and a ground, driven by a bias device, receiving digital signals and a BLANK signal, comprising:
    a thermal code decoder, processing said digital signals and said BLANK signal, having a plurality of outputs;
    a plurality of D-type flip-flops, each receiving the output of corresponding said thermal code decoder, each comprising a reset pin receiving said BLANK and an output terminal, wherein said BLANK is high, said output is low to allow a transient current to continue flowing to said ground;
    a plurality of preprocessors, each receiving the output of one corresponding D-type flip-flop and outputing a signal and an inverted signal of said signal; and
    a plurality of current sources, each receiving corresponding said signal and said inverted signal, each current source comprising:
    a first PMOS transistor, having a source connected to said voltage source, a gate connected to said bias device, and a drain;
    a second PMOS transistor, having a source connected to said drain of said first PMOS transistor, a gate receiving said signal, and a drain acting as the output of said DAC; and
    a third PMOS transistor, having a source connected to said drain of said first PMOS transistor, a gate receiving said inverted signal, and a drain connected to said ground.

3. The device of claim 2, wherein said current source further comprises a fourth PMOS transistor, having a source connected to said drain of said first PMOS transistor, a gate connected to said bias device and a drain connected to said source of said second PMOS and third PMOS transistors.

4. A DAC with noise equalized, placed between a voltage source and a ground, driven by a bias device, receiving digital signals and a BLANK signal, comprising:
    a thermal code decoder, having a plurality of inputs, each input receiving a result of logic AND on an inverted signal of said BLANK signal and each bit of said digital signal, a transient current flowing to said ground in response to a high BLANK signal;
    a plurality of D-type flip-flops, processing said plurality outputs of said thermal code decoder;
    a plurality of preprocessors, each receiving output of one corresponding D-type flip-flop and outputing a signal and an inverted signal of said signal; and
    a plurality of current sources, each receiving corresponding said signal and said inverted signal, each current source comprising:
    a first PMOS transistor, having a source connected to said voltage source, a gate connected to said bias device, and a drain;
    a second PMOS transistor, having a source connected to said drain of said first PMOS transistor, a gate receiving said signal, and a drain acting as the output of said DAC; and
    a third PMOS transistor, having a source connected to said drain of said first PMOS transistor, a gate receiving said inverted signal, and a drain connected to said ground.

5. The device of claim 4, wherein said current source further comprises a fourth PMOS transistor, having a source connected to said drain of said first PROS transistor, a gate connected to said bias device, and a drain connected to said source of said second PMOS and third PMOS transistors.

* * * * *